US012787856B2

(12) United States Patent
Hu et al.

(10) Patent No.: US 12,787,856 B2
(45) Date of Patent: Nov. 3, 2026

(54) LID ASSEMBLY FOR A CHIP PACKAGE

(71) Applicants: Advanced Micro Devices, Inc., Santa Clara, CA (US); ATI Technologies ULC, Thornhill (CA)

(72) Inventors: Suming Hu, Santa Clara, CA (US); Roden Topacio, Ontario (CA); Manish Dubey, Austin, TX (US); Jianguo Li, Ontario (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 573 days.

(21) Appl. No.: 18/128,940

(22) Filed: Mar. 30, 2023

(65) Prior Publication Data

US 2024/0332098 A1 Oct. 3, 2024

(51) Int. Cl.

| | |
|---|---|
| ***H10W 76/12*** | (2026.01) |
| ***H10W 74/01*** | (2026.01) |
| ***H10W 74/10*** | (2026.01) |
| ***H10W 74/15*** | (2026.01) |
| ***H10W 76/138*** | (2026.01) |
| ***H10W 76/60*** | (2026.01) |

(52) U.S. Cl.
CPC ....... *H10W 76/138* (2026.01); *H10W 74/012* (2026.01); *H10W 74/129* (2026.01); *H10W 74/15* (2026.01)

(58) Field of Classification Search
CPC ......................... H01L 2924/171–17798; H01L 2924/161–16798; H01L 25/065–0657; H01L 25/105; H01L 23/02–10; H01L 2924/151–15798; H01L 23/562–576; H01L 23/40–4093; F28F 2275/00–22
See application file for complete search history.

(56) References Cited

U.S. PATENT DOCUMENTS

| | | | | |
|---|---|---|---|---|
| 6,667,544 B1 * | 12/2003 | Glenn | .................. | G02B 6/4214 257/E25.023 |
| 2011/0024892 A1 * | 2/2011 | Lin | ........................ | H10W 40/73 257/E23.098 |
| 2018/0166351 A1 * | 6/2018 | Han | ....................... | H01L 23/053 |
| 2023/0060065 A1 * | 2/2023 | Tsai | ....................... | H10W 72/30 |

FOREIGN PATENT DOCUMENTS

| | | | | |
|---|---|---|---|---|
| JP | 3652488 B2 * | 5/2005 | ............. | H01L 23/10 |

* cited by examiner

*Primary Examiner* — Zandra V Smith
*Assistant Examiner* — Daniel J Hibbert
(74) *Attorney, Agent, or Firm* — Patterson + Sheridan, LLP

(57) ABSTRACT

A chip package includes a package substrate, an integrated circuit (IC) die disposed on the package substrate, and a lid assembly disposed over the IC die. The lid assembly includes a top plate having a lower surface facing the IC die and an outer shoulder. The lid assembly also includes a retainer having a lower surface secured to the package substrate and an inner shoulder retaining to the outer shoulder. The inner shoulder is configured to limit upward movement of the top plate, and expansion of the retainer is decoupled from expansion of the top plate.

22 Claims, 8 Drawing Sheets

LID ASSEMBLY FOR A CHIP PACKAGE

TECHNICAL FIELD

Embodiments of the present invention generally relate to a chip package, and in particular, to chip package having an integrated circuit (IC) die and a lid assembly disposed on a package substrate.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a plurality of integrated circuit (IC) dies to be mounted to a single package substrate. The IC die may include memory, logic or other IC devices.

Out of plane deformation of the chip package can be problematic to conventional chip packaging schemes. In general, a lid on a chip package is less likely to deform than the package substrate. However, deformation of the lid is influenced by the deformation of the package substrate and tends to suffer from the same level of deformation as the package substrate. Lid deformation can lead to poor contact between the lid and the IC die, thereby resulting in poor thermal performance of the lid.

There is a need, therefore, for an improved chip package, and in particular, to a chip package having an improved lid.

SUMMARY

In some embodiments, a chip package includes a package substrate, an integrated circuit (IC) die disposed on the package substrate, and a lid assembly disposed over the IC die. The lid assembly includes a top plate having a lower surface facing the IC die and an outer shoulder. The lid assembly also includes a retainer having a lower surface secured to the package substrate and an inner shoulder retaining the outer shoulder. The inner shoulder is configured to limit upward movement of the top plate, and expansion of the retainer is decoupled from expansion of the top plate.

In another example, a chip package includes a package substrate having a convex configuration, an integrated circuit (IC) die disposed on the package substrate, and a lid assembly disposed over the IC die. The lid assembly includes a top plate having a lower surface facing the IC die and a plurality of sidewalls having a top surface and a bottom surface being angled relative to the top surface. The bottom surface of the plurality of sidewalls is secured to the package substrate.

In another example, a chip package includes a package substrate, an integrated circuit (IC) die disposed on the package substrate, and a lid assembly disposed over the IC die. The lid assembly includes a top plate having a concave configuration and a plurality of sidewalls. The plurality of sidewalls have a top surface supporting the top plate and a bottom surface secured to the package substrate.

In another example, a method of fabricating a chip package includes mounting an integrated circuit (IC) die to a package substrate. A top plate of a lid assembly is positioned above the IC die and includes an outer shoulder. Then a retainer of the lid assembly is secured to the package substrate. The retainer is positioned such that an inner shoulder of the retainer is disposed above and overlapping with the outer shoulder. The assembled chip package is cured under high temperature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a perspective view of a top plate and a retainer of the lid assembly. FIG. 2B is a top view of the lid assembly in which the retainer is disposed over the top plate. FIG. 2C is a cross-sectional view of FIG. 2B along line 2C-2C.

FIG. 3A is a perspective view of a top plate and a retainer of the lid assembly. FIG. 3B is a top view of the lid assembly in which the retainer is disposed over the top plate. FIG. 3C is a cross-sectional view of FIG. 3B along line 3C-3C.

FIG. 4A is a perspective view of a top plate and a retainer of the lid assembly. FIG. 4B is a top view of the lid assembly in which the retainer is disposed over the top plate. FIG. 4C is a cross-sectional view of FIG. 4B along line 4C-4C.

FIG. 5A is a perspective view of a top plate and a retainer of the lid assembly. FIG. 5B is a top view of the lid assembly in which the retainer is disposed over the top plate. FIG. 5C is a cross-sectional view of FIG. 5B along line 5C-5C.

To facilitate understanding, identical reference numerals have been used, where possible, to designate identical elements that are common to the figures. It is contemplated that elements of one embodiment may be beneficially incorporated in other embodiments.

DETAILED DESCRIPTION

In some embodiments, a chip package is provided with a lid assembly having a top plate and a retainer. The retainer includes an inner shoulder retaining an outer shoulder of the top plate and configured to limit upward movement of the top plate. The arrangement of the top plate and the retainer advantageously allows the expansion or deformation of the retainer to be decoupled from the expansion or deformation of the top plate. During manufacture and application, the retainer may act as a stiffener to control out of plane deformation of the package substrate. In some instances, the retainer may undergo deformation along with the package substrate. The decoupling advantageously allows the top plate to maintain its top and bottom surfaces relatively flat during manufacture and application, thereby preserving good contact with the IC die. In this manner, the capacity of the lid assembly to disperse heat may be improved at different temperatures or different amounts of package substrate deformation.

Figure 1:
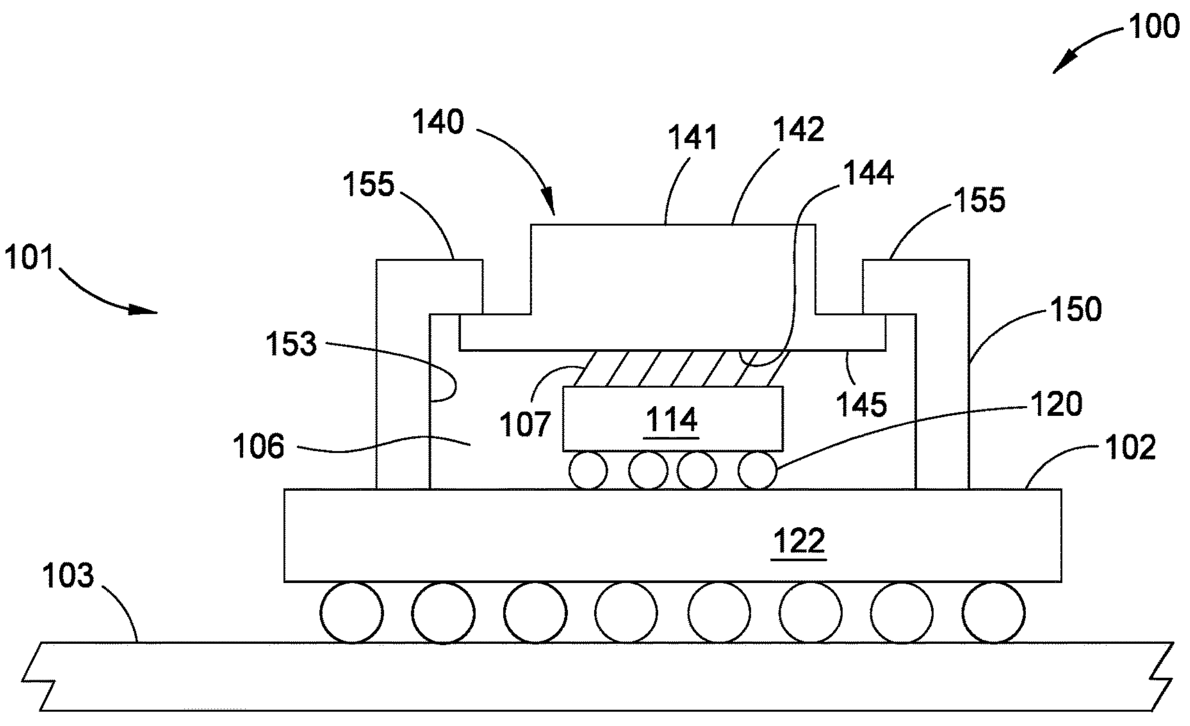
FIG. 1 is a front schematic view of an electronic device having an integrated chip package having an exemplary embodiment of a lid assembly.

Turning now to FIG. 1, an exemplary integrated chip package 101 is schematically illustrated as disposed on a printed circuit board (PCB) 103. A partial sectional view of the chip package 101 is shown in FIG. 1. The chip package 101 and the PCB 103 together form at least part of an electronic device 100. The electronic device 100 may be a tablet, computer, copier, digital camera, smart phone, control system, automated teller machine, server or other solid-state memory and/or logic device.

The chip package 101 includes at least one IC die 114 mounted to a package substrate 122, and a lid assembly 140 coupled to the package substrate 122. In one example, the lid assembly 140 includes a top plate 141 coupled to a retainer 150. The top plate 141 is disposed above the IC die 114. The upper portion of the retainer 150 is configured to retain the top plate 141 above the IC die 114, and the lower portion of the retainer 150 is coupled to the package substrate 122. The retainer 150 is sufficiently sized to circumscribe the IC die 114. The lid assembly 140 beneficially enhances the resistance of the top plate 141 against out of plane deformation, as further discussed below. Although a single IC die 114 is shown in the example depicted in FIG. 1, the number of IC die 114 may range from one to as many as can be fit within the chip package 101.

The package substrate 122 includes circuitry for electrically connecting the IC die 114 to circuitry of the package substrate 122. Solder connections 120, also known as or "micro bumps," are utilized to provide mechanical and electrical connections between the circuitry of the IC die 114 and the circuitry of the package substrate 122. The solder connections 120, when in the form of solder joints, may be fabricated from tin-lead solder, lead-free solder, solder on copper pillar, or other suitable solder. In the example depicted in FIG. 1, solder connections 120 couple the bottom surface of the IC die 114 to the top surface 102 of the package substrate 122. Underfill, not shown, may be utilized to fill the space not taken by the solder connections 120 between the IC die 114 and the package substrate 122.

Solder connections 118, also known as or "solder balls," are utilized to provide mechanical and electrical connections between the circuitry of the PCB 103 and the circuitry of the package substrate 122. Alternatively, the package substrate 122 may be coupled to the PCB 103 by a Pin Grid Array (PGA) or other suitable technique. In the example depicted in FIG. 1, solder connections 118 couple the bottom surface 112 of the package substrate 122 to a top surface of the PCB 103.

As discuss above, the IC die 114 is mounted to the top surface 102 the package substrate 122. The IC die 114 may be programmable logic devices, such as field programmable gate arrays (FPGA), memory devices, optical devices, processors or other IC logic structures. Optical devices include photo-detectors, lasers, optical sources, and the like. Optionally, an interposer may be disposed between the IC die 114 and the package substrate 122.

The lid assembly 140 is coupled to the top surface 102 of the package substrate 122 above the IC die 114 in a manner that reduces the warpage of the top plate 141. The lid assembly 140 may be fabricated from metals, ceramics, thermoplastics, glass reinforced plastics, and carbon reinforced materials, among others. In some examples, the lid assembly 140 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. In one example, at least one of the top plate 141 or the retainer 150 are made from copper with nickel plating. In another example, at least one of the top plate 141 or the retainer 150 are made from stainless steel. In some examples, the top plate 141 can be made of copper with nickel plating, and the retainer 150 can be made of copper, a non-metal material, or a different metal, for example, stainless steel. When fabricated from a thermally conductive material such as a metal, the top plate 141 may be utilized as a heat spreader and/or heat sink that enhances thermal management (i.e., temperature control) of the IC die 114.

Each of the top plate 141 and the retainer 150 may be formed from a single mass of material, or may be formed from multiple components. The top plate 141 and the retainer 150 may be formed by stamping, machining, forging, electric-discharge machining (EDM), or other suitable technique.

Figure 2A:
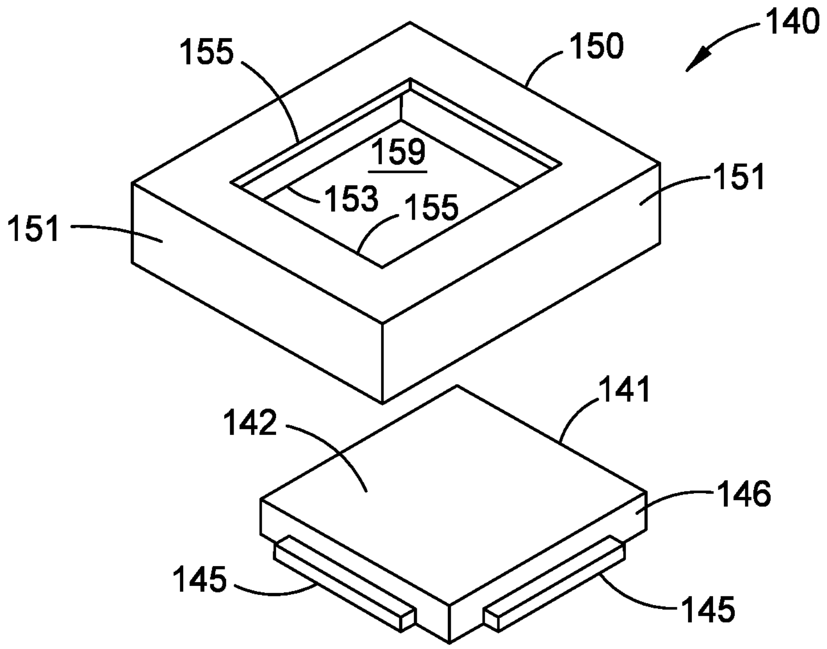
FIG. 2A-2C are different views of the lid assembly of FIG. 1, according to some embodiments.
Figure 2B:
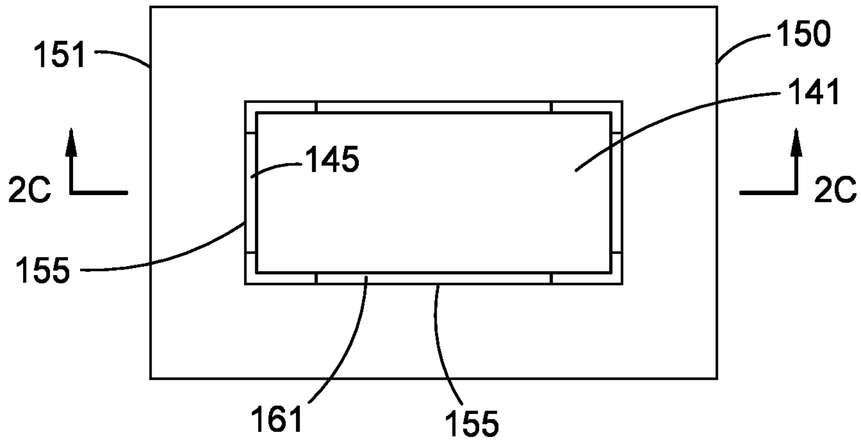
Figure 2C:
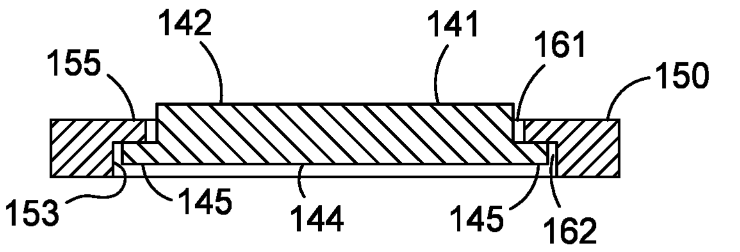

FIG. 2A-2C are different views of the lid assembly 140, according to some embodiments. FIG. 2A is a perspective view of the top plate 141 and the retainer 150 of the lid assembly 140. FIG. 2B is a top view of the lid assembly 140 in which the retainer 150 is disposed over the top plate 141. FIG. 2C is a cross-sectional view of FIG. 2B along line 2C-2C. The top plate 141 has a generally planar shape and includes a top surface 142 and a lower surface 144. When assembled, the top surface 142 faces away from the lower surface 144, while the lower surface 144 faces a top surface of the IC die 114 and the top surface 102 of the package substrate 122. The top plate 141 includes one or more outer shoulders 145 extending outwardly from the sidewalls 146 of the top plate 141. The top surface of the outer shoulders 145 is below the top surface 142 of the top plate 141. In this example, an outer shoulder 145 extends outward from each of the four sidewalls 146 of the top plate 141. The length of the outer shoulders 145 are shorter than the length of the sidewalls 146. In some embodiments, the outer shoulders 145 may extend the full length of the sidewalls 146 and form a continuous outer shoulder 145 around the perimeter of the top plate 141. In some embodiments, each sidewall 146 may have any suitable number of discrete outer shoulders 145, such one, two, three, four, or more outer shoulders 145. In some embodiments, the outer shoulders 145 may be integral with the top plate 141 or may be attached to the top plate 141.

The retainer 150 is configured to retain the top plate 141 above the IC die 114. The retainer 150 has a rectangular shape formed by four sidewalls 151 that circumscribe the top plate 141 and the IC die 114. The lower portion of the sidewalls 151 are attached to the top surface 102 of the package substrate 122. In one example, the bottom surface of the retainer 150 is secured to the top surface 102 of the package substrate 122 utilizing an adhesive, such as an epoxy or other bonding agent. In another example, the bottom surface of the retainer 150 is secured to the top surface 102 of the package substrate 122 utilizing clamps or fasteners. Although in the example of FIG. 1 the retainer 150 has a perpendicular orientation relative to the top plate 141, the retainer 150 may be inclined at an angle other than 90 degrees relative to the top plate 141. It is contemplated the retainer 150 may have any suitable shape that circumscribes the IC die 114.

The upper portion of the retainer 150 includes an inner shoulder 155 extending inwardly from the inner surface 153 of the sidewalls 151. In this example, the inner shoulder 155 extends continuously around the inner surface 153 of the sidewalls 151. However, the inner shoulder 155 may include a plurality of discrete inner shoulders 155. The inner shoulders 155 may extend into an aperture 159 defined by the sidewalls 151. The aperture 159 is sufficiently sized to accommodate the top plate 141. The perimeter formed by the inner shoulders 155 is larger than the perimeter defined by the four sidewalls 146 of the top plate 141 but smaller than the perimeter formed by the outer shoulders 145 of the top plate 141. When assembled, the inner shoulders 155 of the retainer 150 overlap with the outer shoulders 145 of the top plate 141. In this respect, the inner shoulders 155 limit upward movement of the top plate 141. As shown in FIG. 2C and FIG. 1, the inner shoulder 155 is at least partially disposed above the outer shoulders 145 of the top plate 141. In some embodiments, the top surface of the inner shoulder 155 is below the top surface 142 of the top plate 141. In some embodiments, a first gap 161 may be formed between the inner shoulder 155 and the sidewalls of the 146 of the top plate 141. Optionally, a second gap 162 may be formed between the outer shoulders 145 and the inner surface 153 of the retainer 150. Optionally, a third gap may be formed between the bottom surface of the inner shoulder 155 and the upper surface of the outer shoulders 145. The overlapping arrangement of the top plate 141 and the retainer 150 advantageously allows the expansion or deformation of the retainer 150 to be decoupled from the expansion or deformation of the top plate 141. During manufacture and application, the retainer 150 may act as a stiffener to control out of plane deformation of the package substrate 122. In some instances, the retainer 150 may undergo deformation along with the package substrate 122. The decoupling advantageously allows the top plate 141 to maintain its top and bottom surfaces relatively flat during manufacture and application, thereby preserving good contact with the IC die 114. In this manner, the capacity of the lid assembly 140 to disperse heat may be improved at different temperatures or different amounts of package substrate 122 deformation.

Referring additionally to FIG. 1, the top plate 141 and the retainer 150 enclose an internal volume 106 of the chip package 101 in which the IC die 114 resides. The internal volume 106 of the chip package 101 is defined between the lower surface 144 of the top plate 141 of the lid assembly 140 and the top surface 102 of the package substrate 122 and between the inner surfaces 153 of the retainer 150.

In one example, a thermal interface material (TIM) 107 may be disposed between the top surface of the IC die 114 and the lower surface 144 of the top plate 141 of the lid assembly 140 to promote heat transfer therebetween. In one example, the TIM 107 may be a thermally conductive grease, thermally conductive epoxy or other suitable heat transfer promoting material.

In another example, some or all of the internal volume 106 may be filled with a molding material. Optionally, TIM 107 may be utilized between the IC die 114 and the lid assembly 140 in addition to the molding material. In one example, the molding material may be a polymer, epoxy or other suitable material. The molding material provides additional stiffness to the chip package 101, while protecting the IC die 114 from an environment located outside of the chip package 101.

Figure 3A:
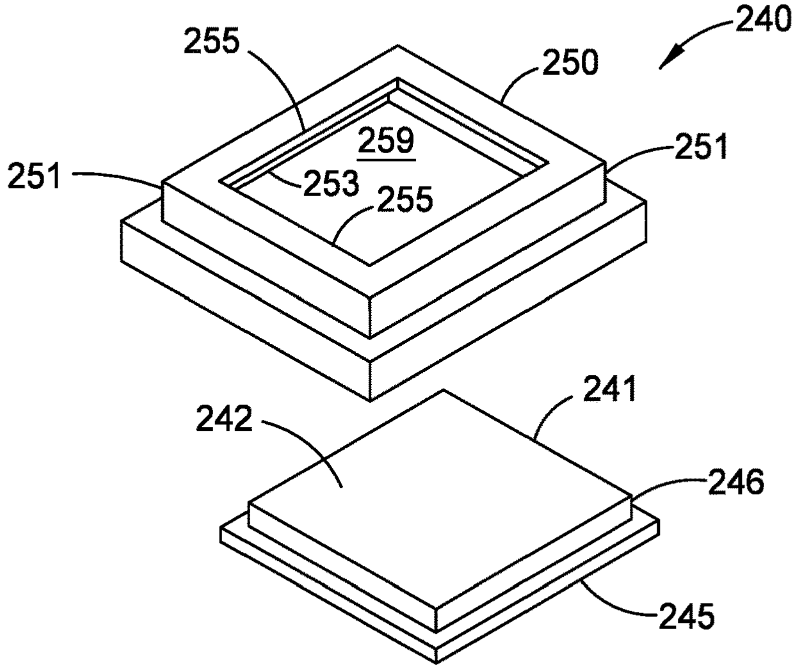
FIG. 3A-3C are different views of another embodiment of a lid assembly.
Figure 3B:
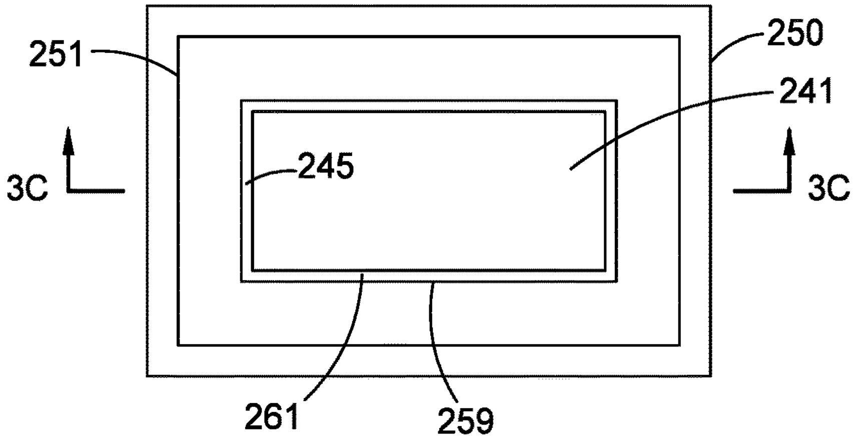
Figure 3C:
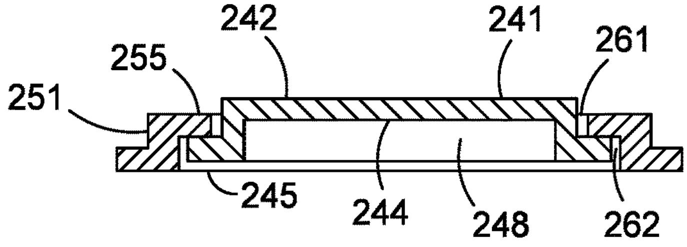

FIG. 3A-3C are different views of another embodiment of the lid assembly 240. FIG. 3A is a perspective view of the top plate 241 and the retainer 250 of the lid assembly 240. FIG. 3B is a top view of the lid assembly 240 in which the retainer 250 is disposed over the top plate 241. FIG. 3C is a cross-sectional view of FIG. 3B along line 3C-3C. The lid assembly 240 is suitable for use as the lid assembly 140 of FIG. 1. The top plate 241 has a generally planar top surface 242 and a lower surface 244.

When assembled with the retainer 250, the top surface 242 faces away from the lower surface 244, while the lower surface 244 faces a top surface of the IC die 114 and the top surface 102 of the package substrate 122. In this embodiment, the top plate 241 includes a continuous outer shoulder 245 extending outwardly from the sidewalls 246 of the top plate 241. The top surface of the outer shoulders 245 is below the top surface 242 of the top plate 241. In some embodiments, the top plate 241 includes one or more discrete outer shoulders 245 extending from each of the four sidewalls 246 of the top plate 241. Each sidewall 246 may have any suitable number of outer shoulders 245, such one, two, three, four, or more outer shoulders 245. In some embodiments, the outer shoulder 245 may be integral with the top plate 241 or may be attached to the top plate 241. A cavity 248 is defined between the lower surface 244 and the inner surface of the sidewalls 246 of the top plate 241. The cavity 248 is sufficiently sized to accommodate the IC die 114.

The retainer 250 is configured to retain the top plate 241 above the IC die 114. The retainer 250 has a rectangular shape formed by four sidewalls 251 that circumscribe the top plate 241 and the IC die 114. The lower portion of the sidewalls 251 are attached to the top surface 102 of the package substrate 122. In this example, the exterior of the sidewalls 251 have a stepwise configuration, although the exterior can have a straight wall configuration, similar to the sidewalls 151 of retainer 150. In one example, the bottom surface of the retainer 250 is secured to the top surface 102 of the package substrate 122 utilizing an adhesive, such as an epoxy or other bonding agent. In another example, the bottom surface of the retainer 250 is secured to the top surface 102 of the package substrate 122 utilizing clamps or fasteners. Although the retainer 250 is shown having a perpendicular orientation relative to the top plate 241, the retainer 250 may be inclined at an angle other than 90 degrees relative to the top plate 241. It is contemplated the retainer 250 may have any suitable shape that circumscribes the IC die 114.

The upper portion of the retainer 250 includes an inner shoulder 255 extending inwardly from the inner surface 253 of the sidewalls 251. In this example, the inner shoulder 255 extends continuously around the inner surface 253 of the sidewalls 251. However, the inner shoulder 255 may include a plurality of discrete inner shoulders 255. The inner shoulders 255 may extend into an aperture 259 defined by the sidewalls 251. The aperture 259 is sufficiently sized to accommodate the top plate 241. The perimeter formed by the inner shoulders 255 is larger than the perimeter defined by the four sidewalls 246 of the top plate 241 but smaller than the perimeter formed by the outer shoulder 245 of the top plate 241. When assembled, the inner shoulder 255 of the retainer 250 overlap with the outer shoulder 245 of the top plate 241. In this respect, the inner shoulder 255 limit upward movement of the top plate 241. As shown in FIG. 3C, the inner shoulder 255 is at least partially disposed above the outer shoulder 245 of the top plate 241. In some embodiments, the top surface of the inner shoulder 255 is below the top surface 242 of the top plate 241. In some embodiments, a first gap 261 may be formed between the inner shoulder 255 and the sidewalls of the 246 of the top plate 241. Optionally, a second gap 262 may be formed between the outer shoulder 245 and the inner surface 253 of the retainer 250. Optionally, a third gap may be formed between the bottom surface of the inner shoulder 255 and the upper surface of the outer shoulder 245. The overlapping arrangement of the top plate 241 and the retainer 250 advantageously allows the expansion or deformation of the retainer 250 to be decoupled from the expansion or deformation of the top plate 241. During manufacture and application, the retainer 250 may act as a stiffener to control out of plane deformation of the package substrate 122. In some instances, the retainer 250 may undergo deformation along with the package substrate 122. The decoupling advantageously allows the top plate 241 to maintain its top and bottom surfaces relatively flat during manufacture and application, thereby preserving good contact with the IC die 114. In this manner, the capacity of the lid assembly 240 to disperse heat may be improved at different temperatures or different amounts of package substrate 122 deformation.

Figure 4A:
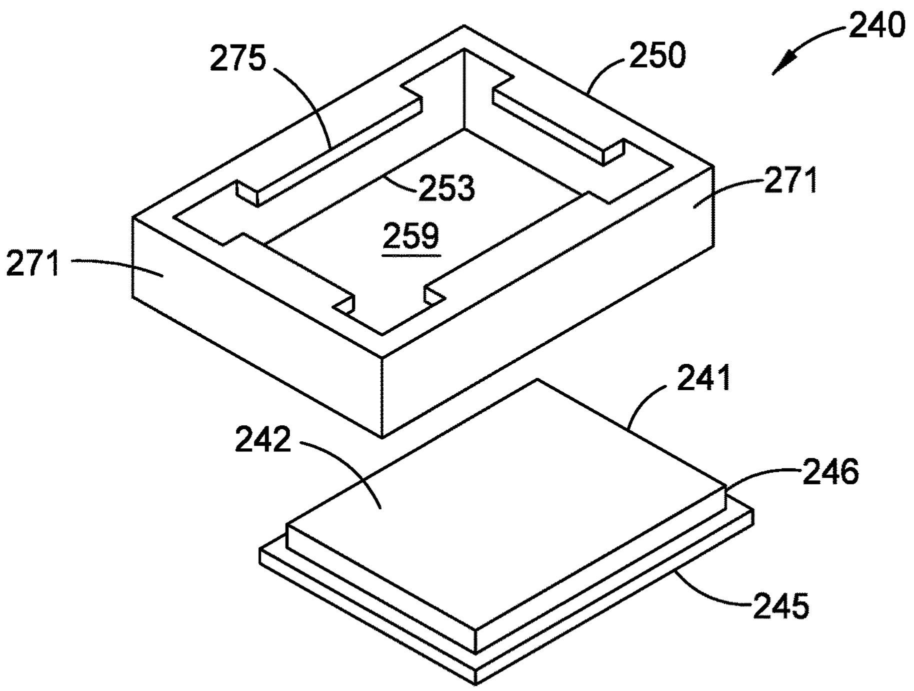
FIG. 4A-4C are different views of another embodiment of the lid assembly.
Figure 4B:
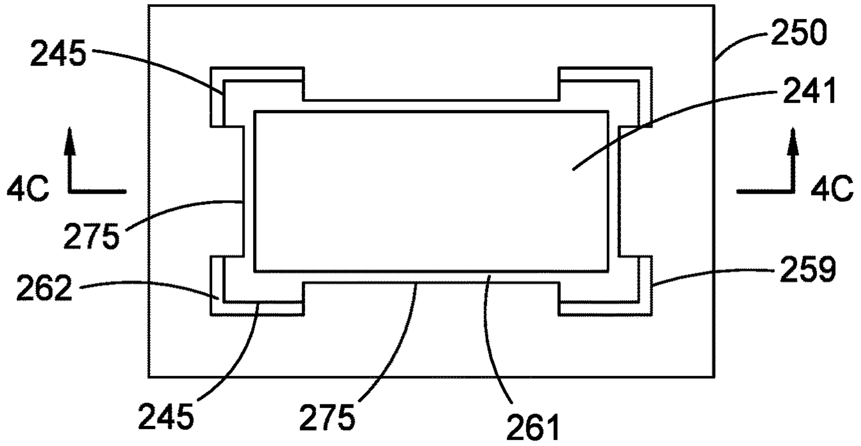
Figure 4C:
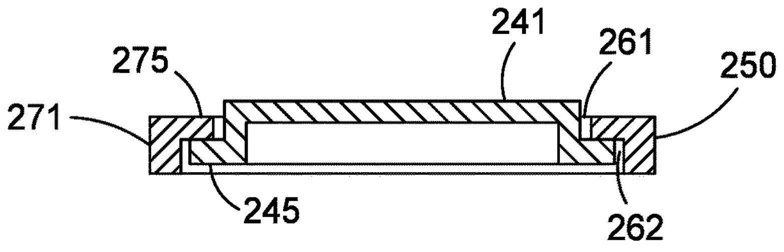

FIG. 4A-4C are different views of another embodiment of the lid assembly 240. FIG. 4A is a perspective view of the top plate 241 and the retainer 250 of the lid assembly 240. FIG. 4B is a top view of the lid assembly 240 in which the retainer 250 is disposed over the top plate 241. FIG. 4C is a cross-sectional view of FIG. 4B along line 4C-4C. The lid assembly 240 is suitable for use as the lid assembly 140 of FIG. 1. In this example, the top plate 241 is the same as the top plate 241 shown in FIG. 3A and will not be discuss further in detail.

The retainer 250 is configured to retain the top plate 241 above the IC die 114. The retainer 250 has a rectangular shape formed by four sidewalls 271 that circumscribe the top plate 241 and the IC die 114. The lower portion of the sidewalls 271 are attached to the top surface 102 of the package substrate 122. In this example, the exterior of the sidewalls 271 has a straight wall configuration, but may be stepwise as shown in FIG. 3A. In one example, the bottom surface of the retainer 250 is secured to the top surface 102 of the package substrate 122 utilizing an adhesive, such as an epoxy or other bonding agent.

The upper portion of the retainer 250 includes a plurality of inner shoulders 275 extending inwardly from the inner surface 253 of the sidewalls 271. Although only one inner shoulder is shown for each sidewall 271, any suitable number of discrete inner shoulders 275 may be formed. The inner shoulders 275 may extend into an aperture 259 defined by the sidewalls 271. The aperture 259 is sufficiently sized to accommodate the top plate 241. The perimeter formed by the inner shoulders 275 is larger than the perimeter defined by the four sidewalls 246 of the top plate 241 but smaller than the perimeter formed by the outer shoulder 245 of the top plate 241. When assembled, the inner shoulder 275 of the retainer 250 overlap with the outer shoulder 245 of the top plate 241. In this respect, the inner shoulder 275 limit upward movement of the top plate 241. As shown in FIG. 4C, the inner shoulder 275 is at least partially disposed above the outer shoulder 245 of the top plate 241. In this example, the aperture 259 is larger than the perimeter of the outer shoulders 245 of the top plate 241. In some embodiments, the top surface of the inner shoulder 275 is below the top surface 242 of the top plate 241. In some embodiments, a first gap 261 may be formed between the inner shoulder 275 and the sidewalls of the 246 of the top plate 241. Optionally, a second gap 262 may be formed between the outer shoulder 245 and the inner surface 253 of the retainer 250. Optionally, a third gap may be formed between the bottom surface of the inner shoulder 275 and the upper surface of the outer shoulder 245. The overlapping arrangement of the top plate 241 and the retainer 250 advantageously allows the expansion or deformation of the retainer 250 to be decoupled from the expansion or deformation of the top plate 241. During manufacture and application, the retainer 250 may act as a stiffener to control out of plane deformation of the package substrate 122. In some instances, the retainer 250 may undergo deformation along with the package substrate 122. The decoupling advantageously allows the top plate 241 to maintain its top and bottom surfaces relatively flat during manufacture and application, thereby preserving good contact with the IC die 114. In this manner, the capacity of the lid assembly 240 to disperse heat may be improved at different temperatures or different amounts of package substrate 122 deformation.

Figure 5A:
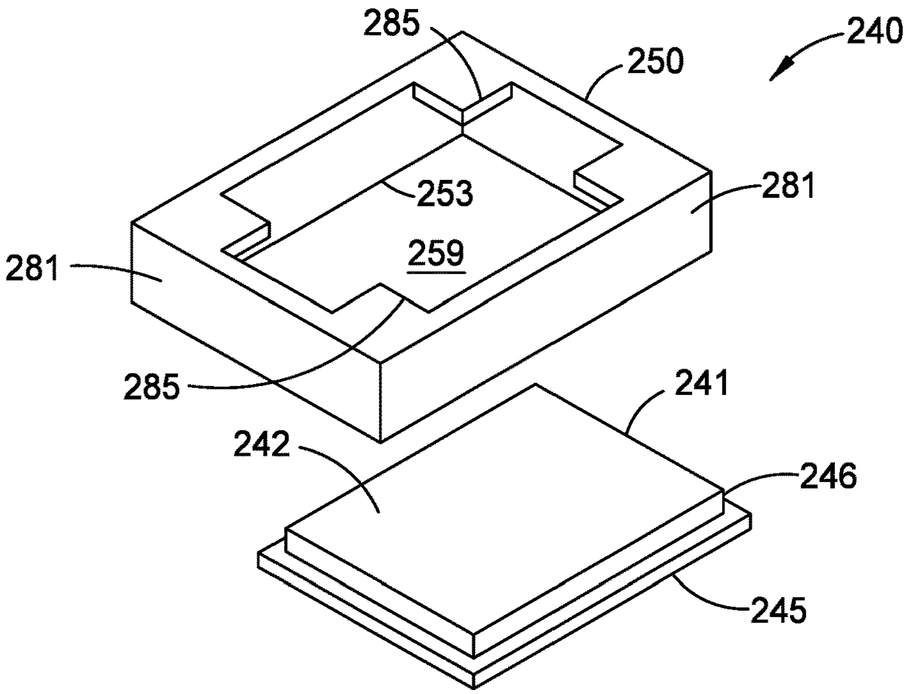
FIG. 5A-5C are different views of another embodiment of the lid assembly.
Figure 5B:
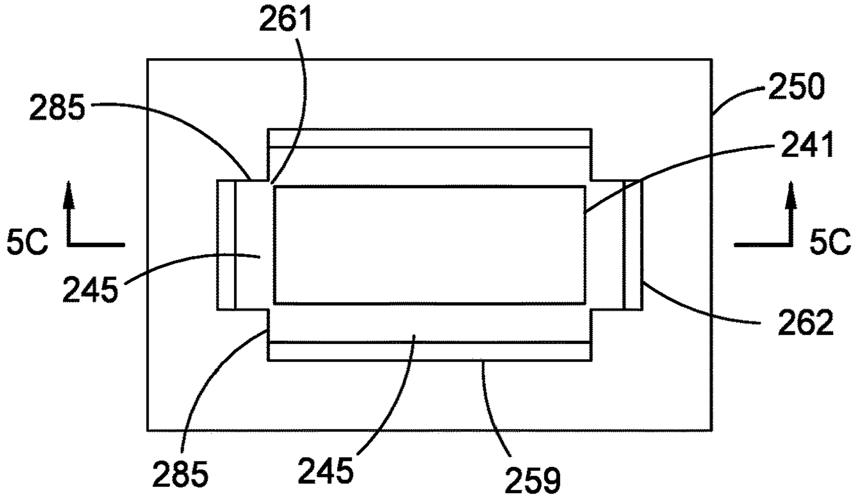
Figure 5C:
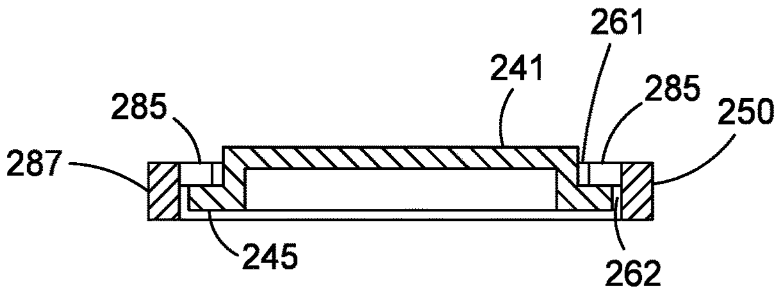

FIG. 5A-5C are different views of another embodiment of the lid assembly 240. FIG. 5A is a perspective view of the top plate 241 and the retainer 250 of the lid assembly 240. FIG. 5B is a top view of the lid assembly 240 in which the retainer 250 is disposed over the top plate 241. FIG. 5C is a cross-sectional view of FIG. 5B along line 5C-5C. The lid assembly 240 is suitable for use as the lid assembly 140 of FIG. 1. In this example, the top plate 241 is the same as the top plate 241 shown in FIG. 3A and will not be discuss further in detail.

The retainer 250 is configured to retain the top plate 241 above the IC die 114. The retainer 250 has a rectangular shape formed by four sidewalls 281 that circumscribe the top plate 241 and the IC die 114. The interior surfaces of the sidewalls 281 define an aperture 259 where the IC die 114 resides. In this example, the exterior of the sidewalls 281 has a straight wall configuration, but may be stepwise as shown in FIG. 3A. The lower portion of the sidewalls 281 are attached to the top surface 102 of the package substrate 122. In one example, the bottom surface of the retainer 250 is secured to the top surface 102 of the package substrate 122 utilizing an adhesive, such as an epoxy or other bonding agent.

The upper portion of the retainer 250 includes a plurality of inner shoulders 285 extending inwardly from the inner surface 253 of the sidewalls 281. In this example, the inner shoulders 285 extend out from two adjacent sidewalls 281 and form a rectangular shaped shoulder. The inner shoulders 285 may take on any suitable shape, so long as the inner shoulders 285 overlap with the outer shoulders 245. For example, the inner shoulder may have an arcuate shape, such as a quarter circle. The inner shoulders 285 may extend into the aperture 259 defined by the sidewalls 281. The aperture 259 is sufficiently sized to accommodate the top plate 241. A perimeter defined by the vertices of the inner shoulders 285 is larger than the perimeter defined by the four sidewalls 246 of the top plate 241 but smaller than the perimeter formed by the outer shoulder 245 of the top plate 241. When assembled, the inner shoulder 285 of the retainer 250 overlap with the outer shoulder 245 of the top plate 241. In this respect, the inner shoulder 285 limit upward movement of the top plate 241. As shown in FIG. 5C, the inner shoulder 285 is at least partially disposed above the outer shoulder 245 of the top plate 241. In this example, the aperture 259 is larger than the perimeter of the outer shoulders 245 of the top plate 241. In some embodiments, the top surface of the inner shoulder 285 is below the top surface 242 of the top plate 241. In some embodiments, a first gap 261 may be formed between the inner shoulder 285 and the sidewalls of the 246 of the top plate 241. Optionally, a second gap 262 may be formed between the outer shoulder 245 and the inner surface 253 of the retainer 250. Optionally, a third gap may be formed between the bottom surface of the inner shoulder 285 and the upper surface of the outer shoulder 245. The overlapping arrangement of the top plate 241 and the retainer 250 advantageously allows the expansion or deformation of the retainer 250 to be decoupled from the expansion or deformation of the top plate 241. During manufacture and application, the retainer 250 may act as a stiffener to control out of plane deformation of the package substrate 122. In some instances, the retainer 250 may undergo deformation along with the package substrate 122. The decoupling advantageously allows the top plate 241 to maintain its top and bottom surfaces relatively flat during manufacture and application, thereby preserving good contact with the IC die 114. In this manner, the capacity of the lid assembly 240 to disperse heat may be improved at different temperatures or different amounts of package substrate 122 deformation.

Figure 6:
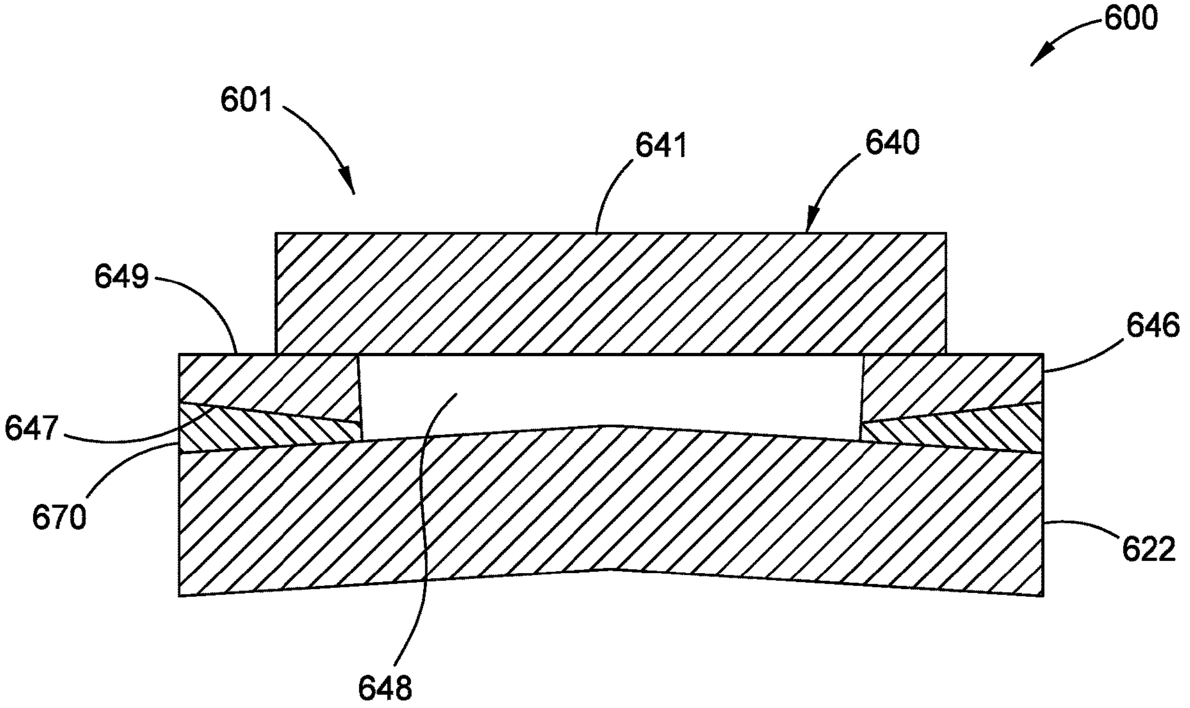
FIG. 6 is a schematic view of another exemplary embodiment of an integrated chip package having a lid assembly disposed on a package substrate.

FIG. 6 is a schematic view of another exemplary embodiment of an integrated chip package 601 having a lid assembly disposed on a package substrate. The chip package 601 may be attached to a PCB, such as PCB 103, to form at least part of an electronic device 600. The electronic device 600 may be a tablet, computer, copier, digital camera, smart phone, control system, automated teller machine, server or other solid-state memory and/or logic device.

The chip package 601 includes at least one IC die mounted to a package substrate 622, and a lid assembly 640 coupled to the package substrate 622. For sake of clarity, the IC die is not shown in FIG. 6, but can be the IC die 114 shown in FIG. 1. In one example, the lid assembly 640 includes a top plate 641 supported by sidewalls 646. The upper portion of the sidewalls 646 is configured to support the top plate 641 above the IC die, and the lower portion of the sidewalls 646 is coupled to the package substrate 622. An internal volume 648 defined by the sidewalls 646 and the top plate 641 is sufficiently sized to circumscribe the IC die. The lid assembly 640 beneficially enhances the resistance of the top plate 641 against out of plane deformation.

In this example, the package substrate 622 has a convex shape that has an apex pointing towards internal volume 648 of the lid assembly 640. As shown, the package substrate 622 has a downward slope from the apex to its sides. The convex shape may be a wide "V" shape, a curved convex shape, or other suitable convex shapes.

The sidewalls 646 support the top plate 641 on the top surface of the package substrate 622. In one example, a portion of the sidewalls 646 extends outward from the sides of the top plate 641. In some examples, the sidewalls 646 may be flush with the sides the top plate 641. In one embodiment, the sidewalls 646 have a trapezoidal shape. As shown, the top surface 649 of the sidewalls 646 is relatively flat (e.g., horizontal). The bottom surface 647 of the sidewalls 646 has an upward slope extending from the interior surface to the exterior surface of the sidewalls 646. The upward slope angle of the bottom surface 647 is in a opposite direction of the convex configuration of the package substrate 622. As shown in FIG. 6, the bottom surface 647 is angled relative to the top surface. As a result of the sloping surfaces, the gap between the sidewalls 646 and the convex configuration of the package substrate 622 increases from the interior surface to the exterior surface of the sidewalls 646.

In one example, the bottom surface of the sidewalls 646 is secured to the top surface of the package substrate 622 utilizing an adhesive 670, such as an epoxy or other bonding agent. Sufficient adhesive is supplied to fill the gap formed between the sidewalls 646 and the package substrate 622.

The convex shape of the package substrate 622 is configured to compensate for potential out of plane deformation during high temperature processing, such as a reflow process. For example, during processing, the sides of the package substrate 622 may bend upward relatively to the middle portion of the package substrate 622. The deformation is advantageously compensated by the convex shape of the package substrate 622. In this respect, the deformation flattens out the convex shape, thereby resulting in the package substrate 622 having a relatively planar shape.

Figure 7:
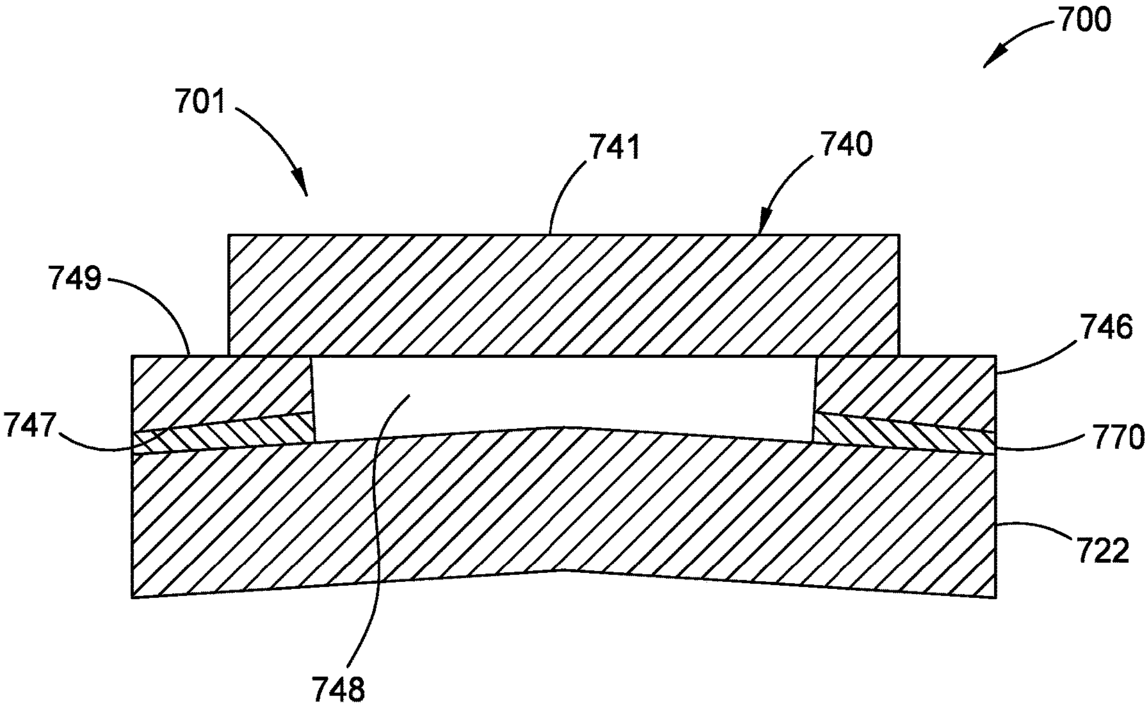
FIG. 7 is a schematic view of yet another exemplary embodiment of an integrated chip package having a lid assembly disposed on a package substrate.

FIG. 7 is a schematic view of another exemplary embodiment of an integrated chip package 701 having a lid assembly disposed on a package substrate. The chip package 701 may form at least part of an electronic device 700. The electronic device 700 may be a tablet, computer, copier, digital camera, smart phone, control system, automated teller machine, server or other solid-state memory and/or logic device.

The chip package 701 includes at least one IC die mounted to a package substrate 722, and a lid assembly 740 coupled to the package substrate 722. For sake of clarity, the IC die is not shown in FIG. 7, but can be the IC die 114 shown in FIG. 1. In one example, the lid assembly 740 includes a top plate 741 supported by sidewalls 746. The upper portion of the sidewalls 746 is configured to support the top plate 741 above the IC die, and the lower portion of the sidewalls 746 is coupled to the package substrate 722. An internal volume 748 defined by the sidewalls 746 and the top plate 741 is sufficiently sized to circumscribe the IC die. The lid assembly 740 beneficially enhances the resistance of the top plate 741 against out of plane deformation.

In this example, the package substrate 722 has a convex shape that has an apex pointing towards internal volume 748 of the lid assembly 740. As shown, the package substrate 722 has a downward slope from the middle portion to its sides. The convex shape may be a wide "V" shape, a curved convex shape, or other suitable convex shapes.

The sidewalls 746 support the top plate 741 on the top surface of the package substrate 722. In one example, a portion of the sidewalls 746 extends outward from the sides of the top plate 741. In some examples, the sidewalls 746 may be flush with sides of the top plate 741. In one embodiment, the sidewalls 746 have a trapezoidal shape. As shown, the top surface 749 of the sidewalls 746 is relatively flat (e.g., horizontal). The bottom surface 747 of the sidewalls 746 has a downward slope extending from the interior surface to the exterior surface of the sidewalls 746. In some embodiments, the bottom surface 747 may have the same or different slope direction as the convex configuration of the package substrate 722. As shown in FIG. 7, the gap between the sidewalls 746 and the package substrate 722 is substantially the same from the interior surface to the exterior surface of the sidewalls 746, although it is contemplated the gap may increase or decrease.

In one example, the bottom surface of the sidewalls 746 is secured to the top surface of the package substrate 722 utilizing an adhesive 770, such as an epoxy or other bonding agent. Sufficient adhesive is supplied to fill the gap formed between the sidewalls 746 and the package substrate 722.

The convex shape of the package substrate 722 is configured to compensate for potential out of plane deformation during high temperature processing, such as a reflow process. For example, during processing, the sides of the package substrate 722 may bend upward relatively to the middle portion of the package substrate 722. The deformation is advantageously compensated by the convex shape of the package substrate 722. In this respect, the deformation flattens out the convex shape, thereby resulting in the package substrate 722 having a relatively planar shape.

Figures 8A, 8B:
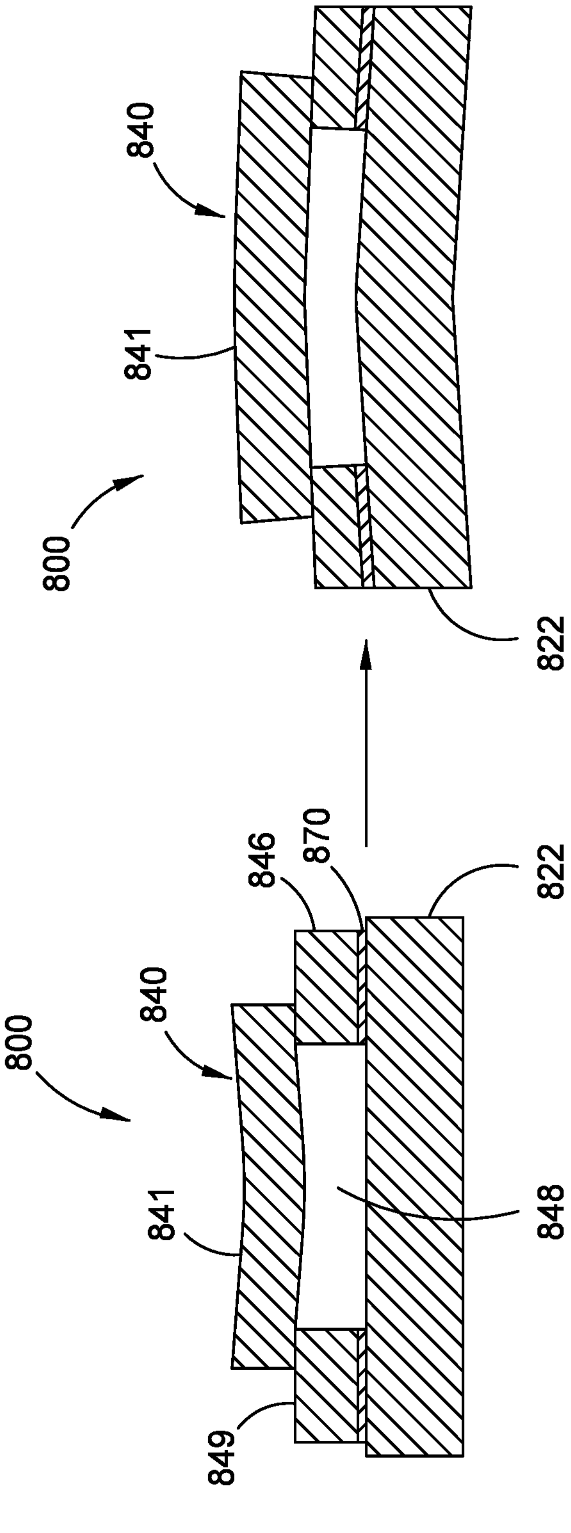
FIG. 8A is a schematic view of yet another exemplary embodiment of an integrated chip package having a lid assembly disposed on a package substrate.
FIG. 8B illustrates the integrated chip package of FIG. 8A after a high temperature process.

FIG. 8A is a schematic view of another exemplary embodiment of an integrated chip package 801 having a lid assembly disposed on a package substrate. The chip package 801 may form at least part of an electronic device 800. The electronic device 800 may be a tablet, computer, copier, digital camera, smart phone, control system, automated teller machine, server or other solid-state memory and/or logic device.

The chip package 801 includes at least one IC die mounted to a package substrate 822, and a lid assembly 840 coupled to the package substrate 822. For sake of clarity, the IC die is not shown in FIG. 8A, but can be the IC die 114 shown in FIG. 1. In this example, the package substrate 822 has a generally planar shape.

In one example, the lid assembly 840 includes a top plate 841 supported by sidewalls 846. The upper portion of the sidewalls 846 is configured to support the top plate 841 above the IC die, and the lower portion of the sidewalls 846 is coupled to the package substrate 822. An internal volume 848 defined by the sidewalls 846 and the top plate 841 is sufficiently sized to circumscribe the IC die. The lid assembly 840 beneficially enhances the resistance of the top plate 841 against out of plane deformation.

In this example, the top plate 841 has a concave shape that has an apex pointing towards internal volume 848 of the lid assembly 840. As shown, the top plate 841 has a downward slope extending from its sides toward the middle portion. The concave shape may be a wide "V" shape, a curved concave shape, or other suitable concave shapes. In some embodiments described herein, the concave shape or the convex shape may be formed by stamping, machining, forging, or other suitable technique.

The sidewalls 846 support the top plate 841 on the top surface of the package substrate 822. In one example, a portion of the sidewalls 846 extends outward from the sides of the top plate 841. In some examples, the sidewalls 846 may be flush with the top plate 841. In one embodiment, the sidewalls 846 have a rectangular shape. As shown in FIG. 8A, the gap between the sidewalls 846 and the package substrate 822 is substantially the same from the interior surface to the exterior surface of the sidewalls 846, although it is contemplated the gap may increase or decrease.

In one example, the bottom surface of the sidewalls 846 is secured to the top surface of the package substrate 822 utilizing an adhesive 870, such as an epoxy or other bonding agent. Sufficient adhesive is supplied to fill the gap formed between the sidewalls 846 and the package substrate 822.

The concave shape of the top plate 841 is configured to compensate for potential out of plane deformation after the lid assembly is attached to the substrate. For example, during processing, the sides of the top plate 841 may bend downward relative to the middle portion of the package substrate 822. The deformation is advantageously compensated by the concave shape of the top plate 841. In this respect, the deformation flattens out the concave shape, thereby resulting in the top plate 841 having a relatively planar shape, as shown in FIG. 8B. It can also be seen that the package substrate 822 takes on a convex shape after deformation.

Figure 9:
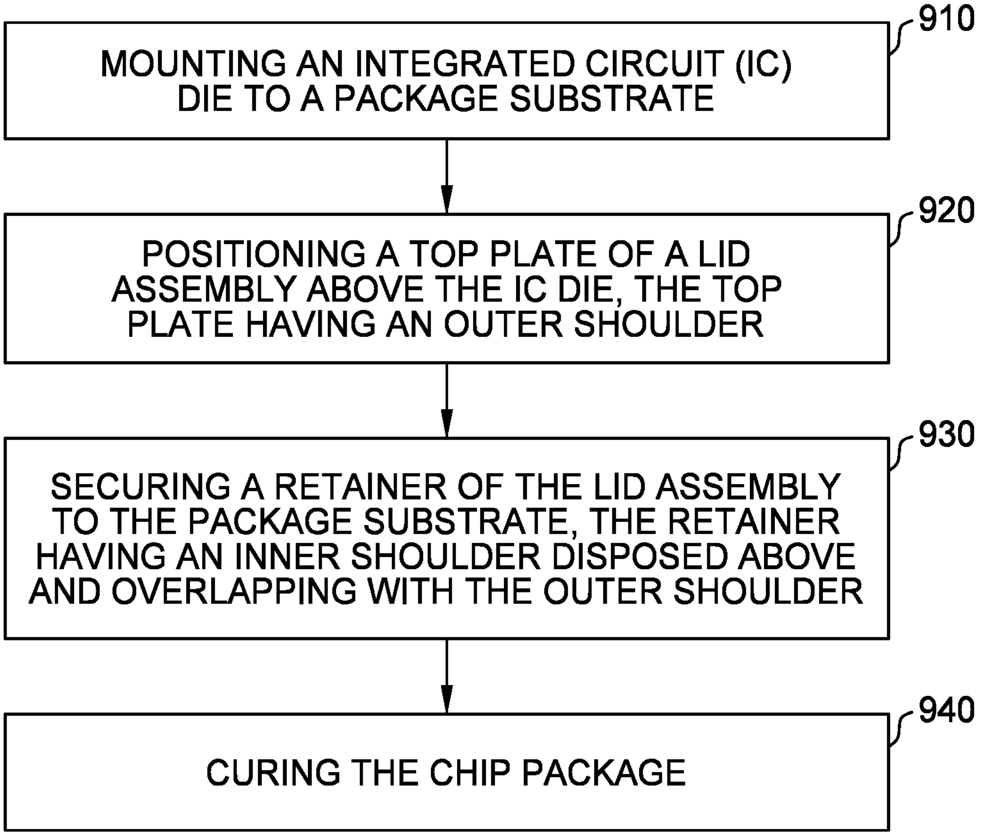
FIG. 9 is a block diagram of an exemplary method of forming a chip package.

FIG. 9 is a block diagram of one example of a method 900 of forming a chip package, such as the chip package 101 described above, among others. The method 500 begins at operation 910 by mounting an IC die 114 on a top surface 102 of a package substrate 122. Mounting of the IC die 114 on the package substrate 122 includes making electrical connections between the circuitry of the die and substrate, for example, through solder or other electro-mechanical connections. At operation 920, the top plate 141 is placed on top of the IC die 114. Prior to placing the top plate 141, a thermal interface material (TIM) 107 is dispensed on the top surface of the IC die 114. In one example, the TIM 107 may be a thermally conductive grease, thermally conductive epoxy or other suitable heat transfer promoting material. At operation 930, the retainer 150 placed on the top surface of the package substrate 122. In one embodiment, an adhesive material is used to attach the retainer 150 to the package substrate 122. Exemplary adhesive material include epoxy or other bonding agent. In some embodiments, the adhesive material and the TIM are dispensed before attaching the top plate 141 and the retainer 150. The retainer 150 is positioned such that the inner shoulders 155 overlap with the outer shoulders 145 of the top plate 141. In this respect, the inner shoulders 155 limit upward movement of the top plate 141. At operation 940, the chip package 101 is cured at high temperature. In some embodiments, oven cure process may be used depending on the adhesive material or TIM material.

Thus, as described above, a chip package and method for fabricating the same are provided which utilize a lid assembly having a top plate and a retainer. The lid assembly is configurable to provide an overall stiffness of the chip package to provide an appropriate resistance to warpage. Advantageously, the overlapping arrangement of the top plate and the retainer advantageously allows the expansion or deformation of the retainer to be decoupled from the expansion or deformation of the top plate. During manufacture and application, the retainer may act as a stiffener to control out of plane deformation of the package substrate. In some instances, the retainer may undergo deformation along with the package substrate. The decoupling advantageously allows the top plate to maintain its top and bottom surfaces relatively flat during manufacture and application, thereby preserving good contact with the IC die. In this manner, the capacity of the lid assembly to disperse heat may be improved at different temperatures or different amounts of package substrate deformation.

In some embodiments, a chip package includes a package substrate, an integrated circuit (IC) die disposed on the package substrate, and a lid assembly disposed over the IC die. The lid assembly includes a top plate having a lower surface facing the IC die and an outer shoulder. The lid assembly also includes a retainer having a lower surface secured to the package substrate and an inner shoulder retaining the outer shoulder. The inner shoulder is configured to limit upward movement of the top plate, and expansion of the retainer is decoupled from expansion of the top plate.

In another example, a chip package includes a package substrate having a convex configuration, an integrated circuit (IC) die disposed on the package substrate, and a lid assembly disposed over the IC die. The lid assembly includes a top plate having a lower surface facing the IC die and a plurality of sidewalls having a top surface and a bottom surface being angled relative to the top surface. The bottom surface of the plurality of sidewalls is secured to the package substrate.

In another example, a chip package includes a package substrate, an integrated circuit (IC) die disposed on the package substrate, and a lid assembly disposed over the IC die. The lid assembly includes a top plate having a concave configuration and a plurality of sidewalls. The plurality of sidewalls have a top surface supporting the top plate and a bottom surface secured to the package substrate.

In another example, a method of fabricating a chip package includes mounting an integrated circuit (IC) die to a package substrate. A top plate of a lid assembly is positioned above the IC die and includes an outer shoulder. Then a retainer of the lid assembly is secured to the package substrate. The retainer is positioned such that an inner shoulder of the retainer is disposed above and overlapping with the outer shoulder. The assembled chip package is cured under high temperature.

While the foregoing is directed to embodiments of the present invention, other and further embodiments of the invention may be devised without departing from the basic scope thereof, and the scope thereof is determined by the claims that follow.

What is claimed is:

1. A chip package comprising:

a package substrate having a bottom side configured for connection to a printed circuit board;

an integrated circuit (IC) die disposed on a top side of the package substrate;

a lid assembly disposed over the IC die, the lid assembly comprising:

a top plate having an outer shoulder and a lower surface facing the IC die; and a retainer having a lower surface secured to the top side of the package substrate and an inner shoulder extending over and capturing the outer shoulder above the package substrate, the inner shoulder configured to limit upward movement of the top plate, wherein expansion of the retainer is decoupled from expansion of the top plate allowing the retainer to move laterally relative to the plate; and thermal interface material contacting the lower surface of the top plate and the IC die.

2. The chip package of claim 1, wherein the inner shoulder circumscribes the outer shoulder.

3. The chip package of claim 2, wherein a gap exists between a bottom surface of the inner shoulder and a top surface of the outer shoulder.

4. The chip package of claim 2, wherein a gap exists between the outer shoulder and the retainer.

5. The chip package of claim 2, wherein a gap exists between the inner shoulder and the top plate.

6. The chip package of claim 1, wherein the top plate comprises a plurality of sidewalls.

7. The chip package of claim 6, wherein the outer shoulder extends outward from each of the plurality of sidewalls of the top plate.

8. The chip package of claim 7, wherein the outer shoulder comprises a continuous outer shoulder around the plurality of sidewalls.

9. The chip package of claim 7, wherein the outer shoulder comprises a plurality of discrete outer shoulders disposed on each of the plurality of sidewalls.

10. The chip package of claim 1, wherein the retainer comprises a plurality of sidewalls circumscribing the IC die.

11. The chip package of claim 10, wherein the inner shoulder extends inward from each of the plurality of sidewalls of the retainer.

12. The chip package of claim 11, wherein the inner shoulder comprises a continuous inner shoulder around the plurality of sidewalls.

13. The chip package of claim 11, wherein the inner shoulder comprises a plurality of discrete inner shoulders disposed on each of the plurality of sidewalls.

14. A chip package comprising:

a package substrate;

an integrated circuit (IC) die disposed on the package substrate; and a lid assembly disposed over the IC die, the lid assembly comprising:

a top plate having an outer shoulder and a lower surface facing the IC die, the top plate having a plurality of sidewalls; and a retainer having a lower surface secured to the package substrate and an inner shoulder extending over and capturing the outer shoulder to the package substrate, the outer shoulder extending outward from each of the plurality of sidewalls of the top plate, the outer shoulder comprising a plurality of discrete outer shoulders disposed on each of the plurality of sidewalls, the inner shoulder configured to limit upward movement of the top plate, wherein expansion of the retainer is decoupled from expansion of the top plate.

15. The chip package of claim 14, wherein the inner shoulder is at least partially disposed over the outer shoulder.

16. The chip package of claim 15, wherein a gap exists between a bottom surface of the inner shoulder and a top surface of the outer shoulder.

17. The chip package of claim 15, wherein a gap exists between the outer shoulder and the retainer.

18. The chip package of claim 15, wherein a gap exists between the inner shoulder and the top plate.

19. The chip package of claim 14, wherein the retainer comprises a plurality of sidewalls circumscribing the IC die.

20. The chip package of claim 19, wherein the inner shoulder extends inward from each of the plurality of sidewalls of the retainer.

21. The chip package of claim 20, wherein the inner shoulder comprises a continuous inner shoulder around the plurality of sidewalls.

22. The chip package of claim 21, wherein the inner shoulder comprises a plurality of discrete inner shoulders disposed on each of the plurality of sidewalls.

* * * * *